United States Patent [19]
Draving

[11] Patent Number: 5,315,627
[45] Date of Patent: May 24, 1994

[54] PSEUDO-RANDOM REPETITIVE SAMPLING OF A SIGNAL

[75] Inventor: Steven D. Draving, Colorado Springs, Colo.

[73] Assignee: Hewlett-Packard Company, Palo Alto, Calif.

[21] Appl. No.: 20,474

[22] Filed: Feb. 22, 1993

[51] Int. Cl.$^5$ .................... H03K 17/26; G01R 29/02
[52] U.S. Cl. ..................................... 377/20; 341/122; 341/123; 328/129.1; 328/63; 328/73; 328/75
[58] Field of Search ................. 377/20; 341/122-123; 328/129.1, 63, 73, 75

[56] References Cited
U.S. PATENT DOCUMENTS

| | | | |
|---|---|---|---|
| 4,870,664 | 9/1989 | Hayashi | 377/20 |
| 5,237,325 | 8/1993 | Klein et al. | 341/122 |
| 5,245,647 | 9/1993 | Grouffal et al. | 377/20 |

Primary Examiner—Margaret Rose Wambach

[57] ABSTRACT

A pseudo-random repetitive sampling circuit which is capable of sampling fast signals, sampling negative and positive time around a trigger event, and rapidly building the waveform for display. The circuit accomplishes this by acquiring negative and positive time in two different ways. Positive time information is acquired using a modified form of sequential sampling, since sequential sampling can rapidly build the signal for samples that occur after the trigger event. The system also may take multiple samples for each trigger event. For samples occurring prior to the trigger event, the system uses a modified form of random repetitive sampling. The modification comprises sampling of the waveform prior to allowing any trigger events to occur, and qualifying each trigger event so that a trigger event is only recognized when it occurs in a programmable time window after a sample.

10 Claims, 4 Drawing Sheets

: 
PSEUDO-RANDOM REPETITIVE SAMPLING OF A SIGNAL

FIELD OF THE INVENTION

This invention relates to electronic circuits and more particularly to test instruments. Even more particularly, the invention relates to a circuit for sampling an input signal for display on a digital oscilloscope.

BACKGROUND OF THE INVENTION

In a digital oscilloscope, an input signal is first digitized by sampling the signal at discreet time intervals to obtain a digital value of the signal at each time interval. Each of these samples is then displayed on the CRT of the oscilloscope. There are three prior art methods commonly used for sampling of the signal: real time sampling, sequential repetitive sampling, and random repetitive sampling.

In real time sampling, the signal is digitized on the fly, in real time. There is a simple one to one correspondence between the samples and the times at which they were taken. That is, all the samples are taken during a single input waveform cycle. The advantage of real time sampling is that it takes all of its measurements over one cycle of the input, therefore, it is capable of sampling a single shot pulse with high throughput. The disadvantage of real time sampling is that it is impossible to do on very fast or high bandwidth signals, because the sample clock must be at least two times faster than the highest frequency component of the input signal.

In sequential sampling, one or more samples of the signal is digitized for each cycle of the input waveform. Therefore, the input signal must be repetitive, and the oscilloscope must be able to locate a triggering point within the repetitive waveform. With each successive triggering of the oscilloscope, new samples are taken. Each new sample point is delayed further from the trigger point than the previous sample, and the delay after each trigger is increased by a fixed amount from the delay of the previous trigger. This method guarantees that at least one sample is taken each trigger, therefore, it is faster at acquiring the waveform than random repetitive sampling and thus has higher throughput. The disadvantage of sequential sampling is that it can only sample positive time, that is, it can only take samples after the trigger.

Random repetitive sampling is similar to sequential sampling, except that the signal is constantly sampled and digitized at a rate determined by the oscilloscope's sampling clock, not by the input signal. After each sample is taken, the time relationship between the time of the sample and the trigger of the waveform is established. After a number of samples have been taken, the signal is reconstructed and displayed on the oscilloscope's display. The advantage of random repetitive sampling is that the waveform can be sampled before and after the trigger location, however, this method of sampling is slow in acquiring the signal over time ranges which are much shorter than the sample clock period and thus has low throughput. For acquisition time ranges less than the sample clock periods, a valid (inside time range) sample is not guaranteed with each trigger event. In fact, the probability of a sample landing inside the acquisition time range on any given trigger is equal to (acquisition time range) / (sample clock period).

Thus, there is a deficiency in the prior art sampling methods. Real time sampling has high throughput and is capable of sampling negative and positive time around the trigger event, however, because of circuit speed limitations it is only usable on low to medium bandwidth signals. Sequential sampling has high bandwidth and high throughput, however, it can only sample positive time after the trigger event. Random repetitive sampling has high bandwidth and can sample negative and positive time, however, it has low throughput, especially at fast sweep speeds.

Thus, there is the need in the art for a system that acquires data in both negative and positive time around the trigger event, is capable of acquiring very fast signals, and can rapidly acquire the signal for display to deliver high throughput. There is a further need in the art for a sampling system that has the high throughput of sequential sampling and the negative time sampling capability of random repetitive sampling. The present invention meets this and other needs.

SUMMARY OF THE INVENTION

It is an aspect of the present invention to sample high bandwidth input signals.

It is another aspect of the invention to sample input signals both before and after a trigger event.

It is still another aspect of the invention to sample such signals while providing high throughput.

The above and other aspects of the invention are accomplished in a circuit which is capable of sampling fast signals, sampling negative and positive time around the trigger event, and rapidly builds the waveform for display. The circuit accomplishes this by acquiring negative and positive time in two different ways. Positive time information is acquired using a modified form of sequential sampling, since sequential sampling can rapidly build the signal for samples that occur after the trigger event.

For samples occurring prior to the trigger event, the system uses a modified form of random repetitive sampling. The modification comprises sampling of the waveform prior to allowing any trigger events to occur, and qualifying each trigger event so that a trigger event is only recognized when it occurs in a programmable time window after a sample.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
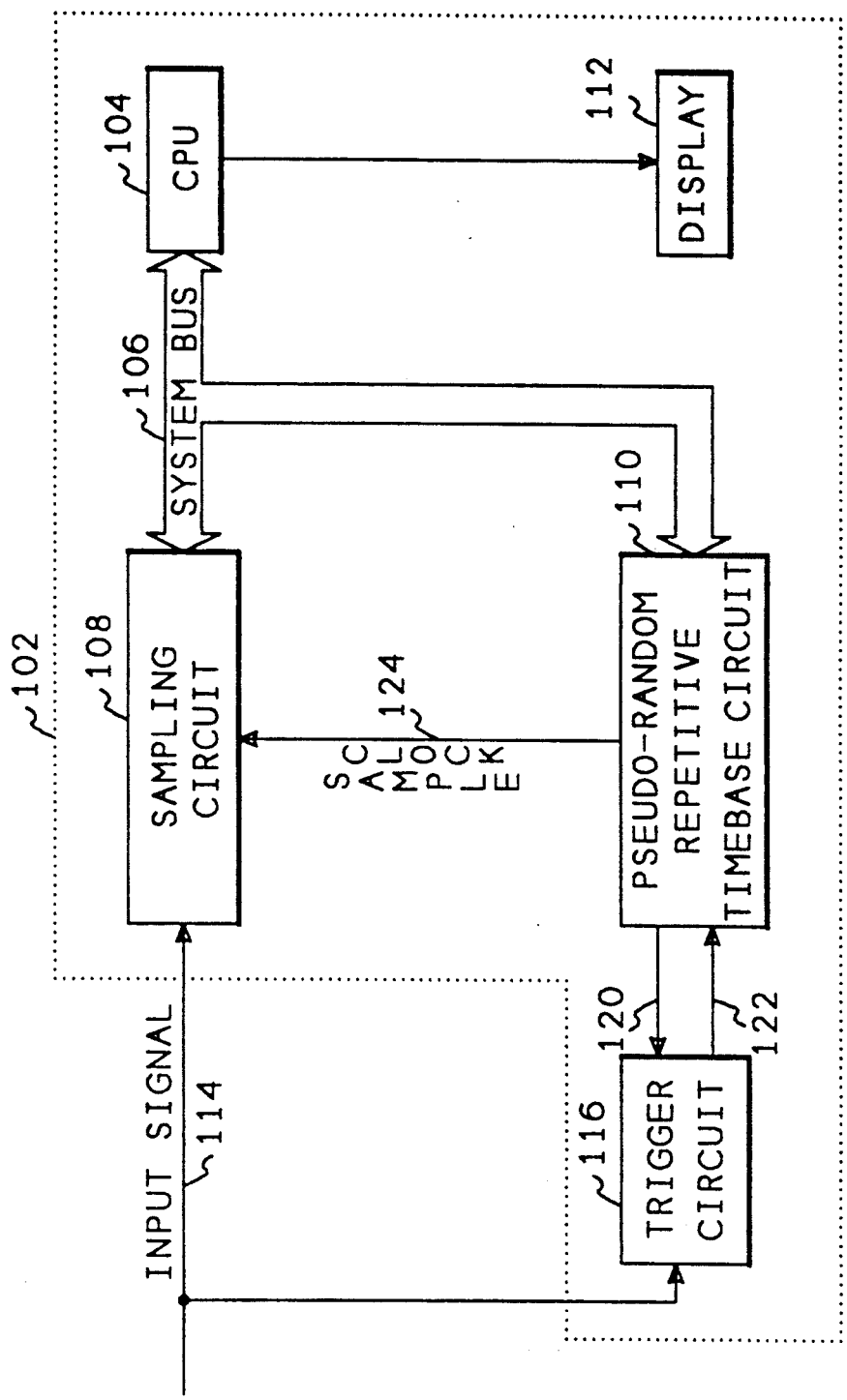
FIG. 1 shows a block diagram of an oscilloscope containing the invention.

FIG. 1 shows a block diagram of a digital oscilloscope incorporating the pseudo random repetitive sampling circuit of the present invention. Referring now to FIG. 1, the digital oscilloscope 102 contains a central processing unit (CPU) 104 which incorporates a processor and memory for program and data storage. The CPU 104 communicates to a sampling circuit 108 and the pseudo random repetitive timebase circuit 110 of the present invention over a system bus 106. The CPU 104 also communicates to a display 112 for displaying signals to a user of the system.

The trigger circuit 116 receives an input signal 114, and determines a trigger point within the signal. The sampling circuit 108 receives a sample clock signal 124, and samples the input signal 114 creating digital values. The digital values are sent to the CPU 104 over the bus 106 where they are accumulated and built into a display of the signal received on input signal 114. The signal which has been built in memory of the CPU 104 is then sent to the display 112.

The pseudo-random repetitive timebase circuit 110, of the present invention, generates a trigger enable signal 120 which tells the trigger circuit 116 whether to recognize trigger events. If trigger events are being recognized, the trigger circuit 116 examines the signal received on input signal 114 and determines when a trigger event occurs. When a trigger event occurs, the trigger circuit 116 sends a trigger signal 122 to the pseudo random repetitive timebase circuit 110. The pseudo random repetitive timebase circuit 110 also sends a sample clock signal 124 to the sampling circuit 108 which tells the sampling circuit 108 when to take samples of the input signal 114. The CPU 104, display 112, trigger circuit 116 and sampling circuit 108, are well known in the digital oscilloscope art and will not be described further.

Figure 2:
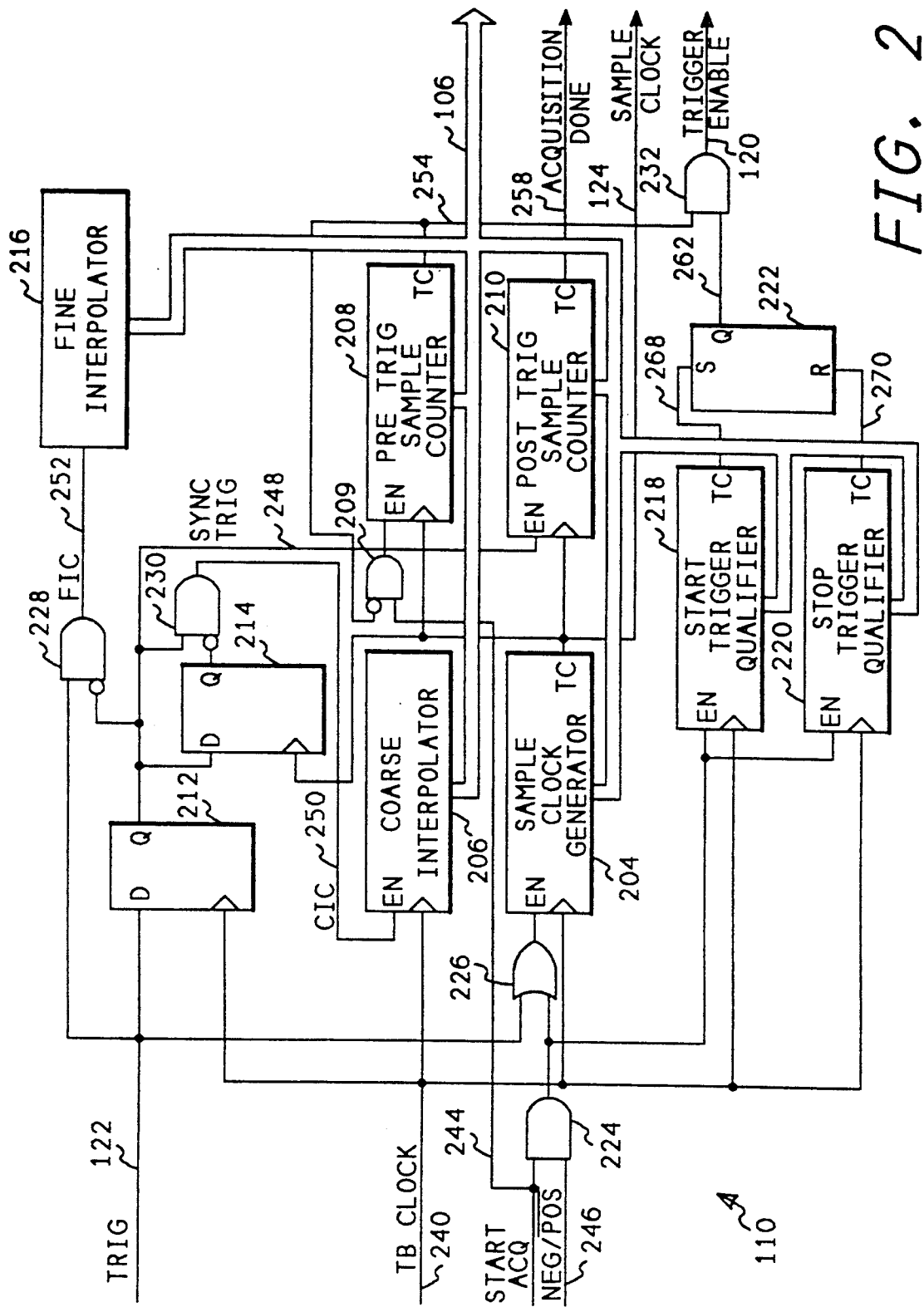
FIG. 2 shows a block diagram of the circuit of the invention.

FIG. 2 shows a detailed block diagram of the pseudo random repetitive timebase circuit 110 of FIG. 1. Referring now to FIG. 2, the circuit 110 contains a sample clock generator 204 which is used to generate the sample clock signal 124. The sample clock generator 204 is a divide by N downcounter which can be parallel loaded over the system bus 106. A time base (TB) clock signal 240 from a stable oscillator is connected to the clock input of the sample clock generator 204 as well as other circuits. Samples are generated by loading an initial number into the sample clock generator 204, allowing the time base clock signal 240 to decrement the sample clock generator until this number reaches zero at which time a terminal count is generated which creates the sample clock 124. The sample clock generator 204 is then reloaded with the same or a new number and the process repeats.

Additional circuitry could be used to perform the reloading operation and relieve the CPU 104 (FIG. 1) of the burden of the reload.

An interpolator circuit is used to measure the time between the occurrence of a trigger and the next occurrence of a sample clock. The interpolator circuit comprises a coarse interpolator 206, which is a counter circuit, a D flip flop 212, a second D flip flop 214, AND gate circuits 228 and 230, and a fine interpolator circuit 216. The fine interpolator circuit 216 measures the time between the occurrence of a trigger signal and the next rising edge of the time base clock signal 240. The coarse interpolator 206 then counts cycles of the time base clock signals between the first rising edge of the time base clock signal after the occurrence of a trigger and the occurrence of the next sample clock signal 124.

The fine interpolator 216 performs analog time measurement and uses a time stretcher circuit. For example, the fine interpolator 216 could charge a capacitor at a fast rate, and then discharge it at a low rate while counting clock cycles to determine how much time had elapsed between the occurrence of the trigger and of the occurrence of the first rising edge of the time base clock after the trigger. Other well-known fine interpolator circuits could also be used.

When a trigger signal (TRIG) 122 is received, the signal causes the output of AND gate 228, FIC signal 252, to go high, which starts the fine interpolator 216. AND gate 228 activates because its other input, which is inverted, is connected to the Q output 248 of D flip flop 212, and this output will be low prior to the receipt of a trigger. The fine interpolator 216 then starts measuring time and will continue to measure time until the FIC signal 252 goes low. At the next rising edge of time base clock signal 240, D flip flop 212 will set. This will cause the output of AND gate 228 to go low, stopping the fine interpolator 216. Thus, the fine interpolator measures time between the occurrence of the trig signal 122 and the first rising edge of the time base clock signal 240.

When the Q output of D flip flop 212, which is the SYNC TRIG signal 248, goes high, the output of AND gate 230, CIC signal 250, goes high to enable the coarse interpolator 206. The coarse interpolator then counts time base clock signal 240 cycles until a sample clock 124 occurs. When the sample clock 124 occurs, it sets D flip flop 214, and the output of this flip flop causes the output of AND gate 230 to go low, disabling coarse interpolator 206. The CPU 104 (FIG. 1) can read the values from the fine interpolator 216 and the coarse interpolator 206 over the bus 106 and determine the amount of time that occurred between the trig signal 122 and the occurrence of the sample clock 124.

Figure 3:
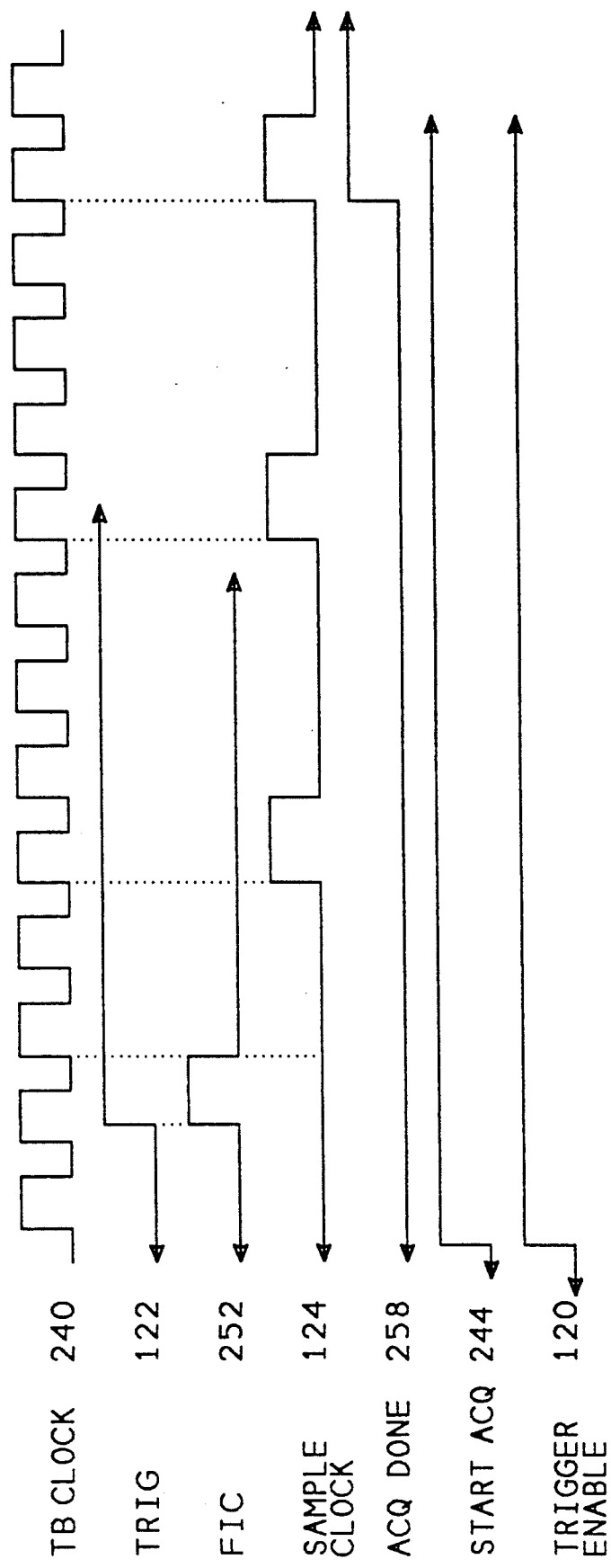
FIG. 3 shows a timing diagram of sampling after a trigger event.
Figure 4:
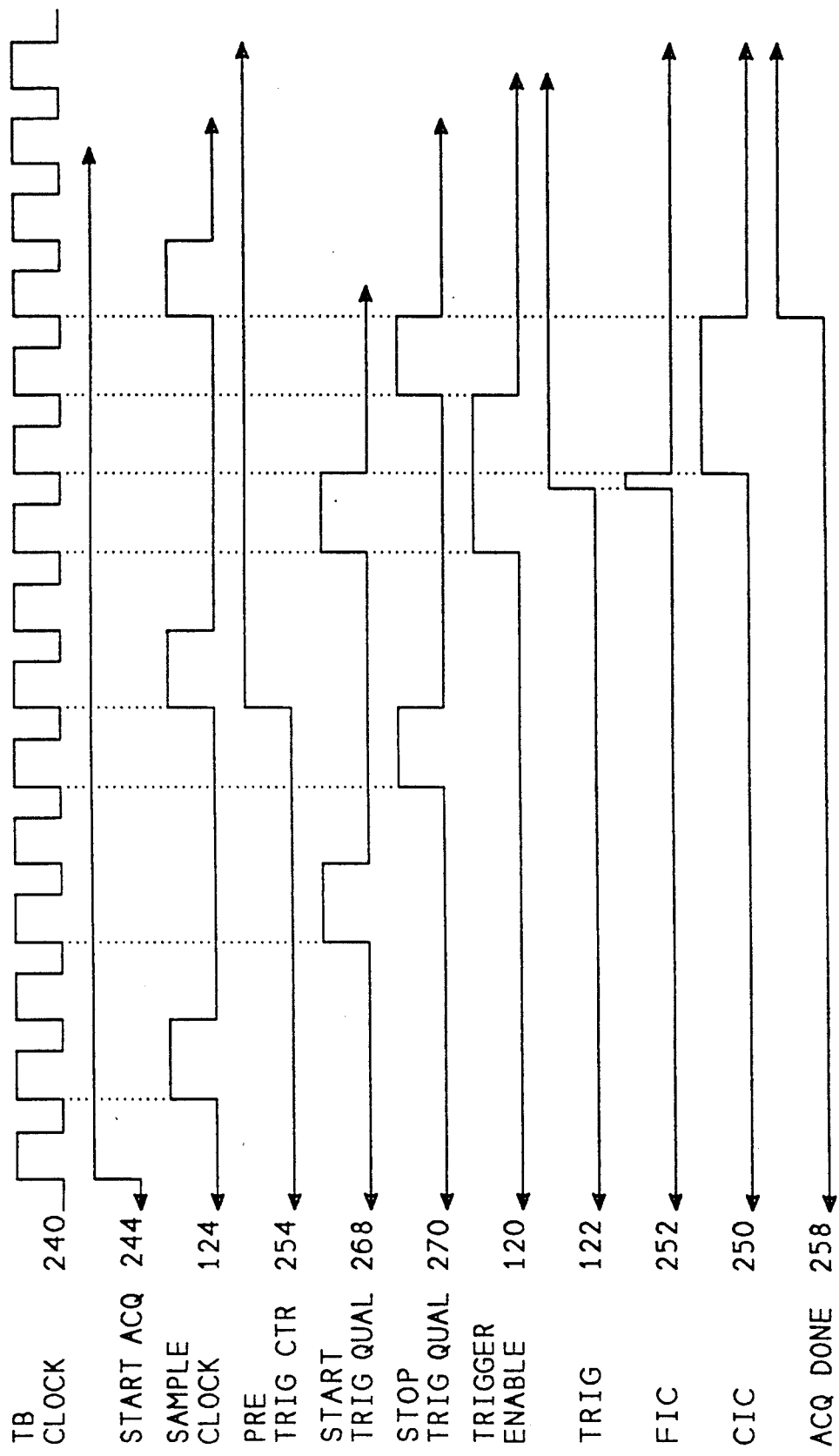
FIG. 4 shows a timing diagram of sampling before a trigger event.

The operation of the remaining parts of FIG. 2 will be described in conjunction with the description of FIGS. 3 and 4 below. FIG. 3 shows a timing diagram of the signals of FIG. 2 while the circuit is acquiring samples after a trigger event, that is, during positive time. The timing diagram of FIG. 4 shows the signals of FIG. 2 while the circuit is acquiring samples prior to a trigger, that is, during negative time.

When sampling in positive time, the CPU 104 sets the NEG/POS signal 246 low to prevent AND gate 224 from activating the sample clock generator 204. Therefore, the sample clock generator will not be activated until a trigger signal 122 is received. When the trigger signal 122 is received, it causes OR gate 226 to enable the sample clock generator 204. Once enabled, sample clock generator 204 creates sample clock signal as discussed above. As each sample clock signal occurs, post trig sample counter 210 is decremented. The post trig sample counter 210 is loaded from the CPU 104 over the bus 106 and the value loaded determines the number of samples to be taken for each trigger event. Thus, when sampling in positive time, the circuit is capable of taking more than one sample per trigger event, however, post trig sample counter 210 could be set to a value of one so that only a single sample is taken per trigger event. After the desired number of samples have been taken, the terminal count output 258 of post trig sample counter 210 goe high indicating that acquisition is done.

Additional circuitry (not shown) could be added to the parallel load input of sample clock generator 204, to load a post trigger sample delay value into the sample clock generator to cause the sample clock generator to delay an amount of time after the trigger event before generating the first sample clock 124. This creates the different delay after each trigger used for sequential sampling. Thereafter, a second value could be loaded into the sample clock generator 204 to set the time interval between successive sample clocks. For slower signals, these two different values could be loaded from the CPU 104, however, for faster signals the additional circuitry would be desirable. This additional circuitry comprises a register to hold the second value, since the first value can be loaded directly from the CPU 104.

FIG. 3 shows a timing diagram of the signals during positive time acquisition. Referring now to FIG. 3, the time base clock signal 240 is a continuously running clock signal. When a trigger 122 occurs, FIC signal 252 is activated to start the fine interpolator 216. At the next rising edge of the time base clock signal 240 after the trigger event, the sample clock generator 204 is enabled and it counts down until the occurrence of the first sample clock 124. At this same time FIC signal 252 goes low to deactivate the fine interpolator.

The sample clock generator 204 continues to run until the post trig sample counter 210 decrements to zero and sets ACQ DONE signal 258.

For negative time acquisition, the circuit operates in a different manner. The CPU 104 sets the NEG/POS signal 246 to indicate negative time acquisition which allows the output of AND gate 224 to go high when the start acquisition signal 244 goes high. When the output of AND gate 224 goes high, it enables OR gate 226 which in turn enables the sample clock generator 204. Thereafter, the sample clock generator 204 will generate sample clocks 124 as described above.

In negative time acquisition, it is desirable to take some samples prior to allowing a trigger event. This is accomplished by loading a value into a pre trig sample counter 208. Once a value is loaded into the pre trig sample counter 208, and start acquisition signal 244 is activated, the pre trig sample counter 208 will decrement with each occurrence of the sample clock 124. When the pre trig sample counter 208 reaches zero, the terminal count output signal 254 enables one input of AND gate 232. AND gate 209 then holds the terminal count output signal 254 high until the next acquisition cycle.

The other input to AND gate 232 is from the trigger qualifier circuit. The trigger qualifier circuit comprises start trigger qualifier counter 218 and stop trigger qualifier counter 220 as well as set/reset flip flop 222. The trigger qualifier circuit is designed to allow a trigger to occur within a fixed time window starting at a defined time before each sample clock. The delay between this trigger qualifier window and the next sample clock is programmable by loading an initial value into the start trigger qualifier 218 which defines the amount of delay after START ACQ 244 goes high before the before the beginning of the first qualifier window. A second value is loaded into the stop trigger qualifier counter 220 which defines the amount of time after START ACQ 244 goes high before the first trigger qualifier window ends. These two values are loaded over the bus 106 by the CPU 104. After the values are loaded, the occurrence of START ACQ 244 enables both counters and they start to decrement. After pre-trigger sample counter 208 goes high, start trigger qualifier counter 218 decrements to zero, and its terminal count output 268 sets the set/reset flip flop 222 which enables AND gate 232 and also causes trigger enable signal 120 to go high. The value loaded into the stop trigger qualifier counter 220 is larger than the start trigger qualifier counter value, therefore, the stop trigger qualifier counter continues to decrement to create a trigger enable window. When the stop trigger qualifier counter 220 reaches zero, its terminal count output 270 resets set/reset flip flop 222 causing the trigger enable signal 120 to go low. Just like the sample clock generator 204, as each trigger qualifier counter reaches terminal count, it is loaded with the sample clock period value. This guarantees that the trigger qualifier window repeats at the same periodic rate as the sample clock and with the same phase relationship.

The interpolator circuit described above operates in the same manner as for positive time acquisition.

FIG. 4 shows a timing diagram of negative time acquisition. Referring now to FIG. 4, time base clock signal 240 is a free running clock. When start acquisition signal 244 occurs, the sample clock generator 204 is enabled and sample clock 124 starts outputting periodic signals. Also, start trigger qualifier counter 218 is enabled and it decrements for a period of time; in the example of FIG. 4 start trigger qualifier 218 is loaded with a value to cause it to decrement for two sample clock times. After decrementing to zero, the start trigger qualifier signal 268 is set to one. In the example of FIG. 4, stop trigger qualifier counter 220 is loaded with a value to cause it to decrement for a time of four time base clock cycles. Therefore, after decrementing to zero, the stop trigger qualifier counter 220 reaches zero and stop trigger qualifier signal 270 is set high. The sample clock generator 204, start trigger qualifier 218, and stop trigger qualifier 220 are all initially loaded with different values to cause them to reach terminal count at different times. However, they all load the same value from then on, so that they each reach terminal count at the same periodic rate.

In the example of FIG. 4, pretrigger sample counter 208 is loaded with a value of two, so it has not yet decremented to zero at the time of the first occurrence of the start and stop trigger qualifier signals. Therefore, the trigger enable signal is not active during these first start and stop trigger qualifying times. After the pretrigger counter has decremented to zero, the next occurrence of the second sample clock 124 will enable its output, and thereafter the occurrence of the start trigger qualifier 268 will cause the trigger enable signal 120 to activate.

Once the trigger enable signal 120 is active, the circuit will recognize trigger events. If a trigger event occurs while the trigger enable signal 120 is active, the interpolator circuit will activate due to the occurrence of the trigger signal 122. At this time FIC signal 252 will activate, enabling the fine interpolator, and at the rising edge of the next time base clock signal 240 CIC signal 250 will activate enabling the coarse interpolator 206. In this manner, the interpolator circuit will measure the time between the trigger event and the occurrence of the next sample clock. This enables the CPU 104 to use the occurrence of the trigger event in building the output signal.

At some time ranges, both negative and positive time data may be acquired during a single trigger. This case works like the negative case except that post trigger sample counter is also used.

As described above, the pseudo random repetitive sampling circuit of the present invention uses a modified form of sequential sampling to acquire samples during positive time. The through-put is higher than random repetitive sampling because the probability of a sample landing in the acquisition time range is (acquisition time range) / (timebase clock period), and the timebase clock period can be much less than the sample clock period. The circuit also uses a form of random repetitive sampling to acquire signals during negative time, however, the circuit qualifies the random repetitive sampling with the trigger qualification circuit and with the pretrigger sample counter, thus, improving the acquisition throughput.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A circuit for sending a sample signal, said sample signal being used to cause analog to digital conversion of an input signal, said circuit comprising:
   means for creating a negative time signal, said negative time signal being set to a value of one when sending sample signals before an occurrence of a trigger signal, and said negative time signal being set to a value of zero when sending sample signals after an occurrence of said trigger signal;
   means for sending a sample signal at least once after an occurrence of said trigger signal when said negative time signal is zero;
   trigger qualifying circuit means for creating a trigger qualifying signal that starts a first predefined amount of time after each sample signal is sent, and ends a second predefined amount of time after each sample signal is sent; and
   means for sending a sample signal at a random time before an occurrence of said trigger signal, and for retaining data obtained by digital conversion caused by said sample signal, when said negative time signal is one, and further when said trigger signal occurs coincident with said trigger qualifying signal.

2. The circuit of claim 1 further comprising programmable counter means for counting a number of times said sample signal is sent after each occurrence of said trigger signal.

3. The circuit of claim 1 further comprising means for measuring an amount of time between an occurrence of said trigger signal and a time when said sample signal is sent.

4. The circuit of claim 1 further comprising means for blocking said trigger signal until a programmable number of sample signals are sent, when said negative time signal is one.

5. The circuit of claim 1 wherein said trigger qualifying circuit comprises programmable means for defining said first predefined amount of time and second programmable means for defining said second predefined amount of time.

6. A circuit for sending a sample signal within a digitizing oscilloscope, said sample signal being used to cause analog to digital conversion of a signal input to said digitizing oscilloscope, said circuit comprising:
   means for creating a negative time signal, said negative time signal being set to a value of one when sending sample signals before an occurrence of a trigger signal, and said negative time signal being set to a value of zero when sending sample signals after an occurrence of said trigger signal;
   means for sending a sample signal at least once after an occurrence of said trigger signal when said negative time signal is zero;
   programmable trigger qualifying circuit means for creating a trigger qualifying signal that starts a first programmable amount of time after each sample signal is sent, and ends a second programmable amount of time after each sample signal is sent; and
   means for sending a sample signal at a random time before an occurrence of said trigger signal, and for retaining data obtained by digital conversion caused by said sample signal, when said negative time signal is one, and further when said trigger signal occurs coincident with said trigger qualifying signal.

7. The circuit of claim 6 further comprising programmable counter means for counting a number of times said sample signal is sent after each occurrence of said trigger signal.

8. The circuit of claim 6 further comprising means for measuring an amount of time between an occurrence of said trigger signal and a time when said sample signal is sent, when said negative time signal is zero.

9. The circuit of claim 6 further comprising means for blocking said trigger signal until a programmable number of sample signals are sent, when said negative time signal is one.

10. A circuit for sending a sample signal within a digitizing oscilloscope, said sample signal being used to cause analog to digital conversion of a signal input to said digitizing oscilloscope, said circuit comprising:
    means for creating a negative time signal, said negative time signal being set to a value of one when sending sample signals before an occurrence of a trigger signal, and said negative time signal being set to a value of zero when sending sample signals after an occurrence of said trigger signal;
    means for sending a sample signal at least once after an occurrence of said trigger signal when said negative time signal is zero;
    means for counting a number of times said sample signal is sent after each occurrence of said trigger signal when said negative time signal is zero;
    means for measuring an amount of time between an occurrence of said trigger signal and a time when said sample signal is sent;
    programmable trigger qualifying circuit means for creating a trigger qualifying signal that starts a first programmable amount of time after each sample signal is sent, and ends a second programmable amount of time after each sample signal is sent;
    means for sending a sample signal at a random time before an occurrence of said trigger signal, and for retaining data obtained by digital conversion caused by said sample signal, when said negative time signal is one, and further when said trigger signal occurs coincident with said trigger qualifying signal;

means for measuring an amount of time between said random time and a time when said trigger signal is received; and means for blocking said trigger signal until a programmable number of sample signals are sent, when said negative time signal is one.

* * * * *